United States Patent

Yamaguchi et al.

(10) Patent No.: US 10,096,757 B2
(45) Date of Patent: Oct. 9, 2018

(54) LED PACKAGE

(71) Applicant: TOYODA GOSEI CO., LTD., Kiyosu-shi (JP)

(72) Inventors: Seiji Yamaguchi, Kiyosu (JP); Hiroshi Ito, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/441,108

(22) Filed: Feb. 23, 2017

(65) Prior Publication Data

US 2017/0263834 A1 Sep. 14, 2017

(30) Foreign Application Priority Data

Mar. 9, 2016 (JP) ................................ 2016-045841

(51) Int. Cl.
- *H01L 33/00* (2010.01)
- *H01L 33/62* (2010.01)
- *H01L 33/54* (2010.01)
- *H01L 33/56* (2010.01)

(52) U.S. Cl.
CPC .............. *H01L 33/62* (2013.01); *H01L 33/54* (2013.01); *H01L 33/56* (2013.01)

(58) Field of Classification Search
CPC .......................................... H01L 33/52–33/62
See application file for complete search history.

(56) References Cited

U.S. PATENT DOCUMENTS

| 6,998,776 B2* | 2/2006 | Aitken | ................... | C03C 3/072 |
| | | | | 313/512 |
| 2005/0211997 A1* | 9/2005 | Suehiro | .................. | H01L 33/20 |
| | | | | 257/88 |

FOREIGN PATENT DOCUMENTS

| JP | 2005-223222 A | 8/2005 |
| JP | 2010-268013 A | 11/2010 |
| JP | 2015-032642 A | 2/2015 |

* cited by examiner

*Primary Examiner* — Syed Gheyas
(74) *Attorney, Agent, or Firm* — McGinn IP Law Group, PLLC

(57) ABSTRACT

To prevent cracks on a sealing glass or a substrate in a LED package in which a light-emitting device is sealed with a sealing glass. The LED package comprises a substrate, a LED mounted on the substrate, and a sealing glass for sealing a LED formed on the substrate. A wiring pattern being connected to an electrode of the LED is formed on the surface of the substrate. A back electrode pattern is formed on the rear surface of the substrate. A columnar via is formed in the substrate. Thus, the wiring pattern on the surface of the substrate and the back electrode pattern on the rear surface of the substrate are electrically connected. A softening point of the substrate is set higher than softening point of the sealing glass.

5 Claims, 2 Drawing Sheets

LED PACKAGE

BACKGROUND OF THE INVENTION

Field of the Invention

The present invention relates to a LED package in which a light-emitting device is sealed with a sealing glass, and more specifically, to a LED package characterized by a substrate on which a light-emitting device is mounted.

Background Art

A LED package is known in which a light-emitting device such as blue LED is sealed with glass (for example, Patent Documents 1 to 3). Such LED package has the advantages of being superior in light resistance and heat resistance compared to conventional resin sealing, and being superior in environment resistance such as gas not permeating.

In the glass-sealed LED package, a ceramic substrate is often used as a substrate for mounting a light-emitting device (Patent Documents 1 to 3). Patent Document 2 describes that glass ceramic made by mixing and sintering glass powder and ceramic powder is used as a substrate, and Patent Documents 2 and 3 describe that a glass substrate is used.

Patent Document 1: Japanese Patent Application Laid-Open (kokai) No. 2005-223222
Patent Document 2: Japanese Patent Application Laid-Open (kokai) No. 2015-32642
Patent Document 3: Japanese Patent Application Laid-Open (kokai) No. 2010-268013

However, when a ceramic substrate is employed, cracks may occur in the sealing glass or the ceramic substrate due to a difference in linear expansion coefficient between the sealing glass and the ceramic substrate. There was a reliability problem. In Patent Documents 2 and 3, employment of a glass substrate is described, but it is unknown which glass material is specifically employed as a substrate.

SUMMARY OF THE INVENTION

In view of the foregoing, an object of the present invention is to suppress cracks from occurring in the sealing glass or the substrate in the glass-sealed LED package, thereby improving reliability of the LED package.

The present invention is a LED package comprising a substrate, a light-emitting device mounted on the substrate, and a sealing glass formed on the substrate for sealing the light-emitting device, wherein the substrate is made of glass, and the linear expansion coefficient of the substrate is 0.9 times to 1.1 times the linear expansion coefficient of the sealing glass.

Electrical connection between the light-emitting device and the outside is structured, for example, as follows. The substrate has a plate shape, and the structure further has a wiring pattern being formed on the surface of the substrate on which the light-emitting device is mounted and being connected to the light-emitting device, a via passing through the substrate and being connected to the wiring pattern, and a back electrode pattern being formed on the surface opposite to the surface of the substrate on which the light-emitting device is mounted and being connected to the wiring pattern through the via. In this case, glass sealing can be accurately performed by making the softening point of the substrate higher than that of the sealing glass. Glass sealing can be more easily performed when the softening point of the substrate is higher than 600° C. and the softening point of the sealing glass is 200° C. to 500° C.

Electrical connection between the light-emitting device and the outside may also be structured as follows. A circuit frame is formed on a substrate and connected to a light-emitting device, and both ends of the circuit frame protrude to the outside from the end of a sealing glass. In this case, the substrate may have various shapes because it is not necessary to form a wiring pattern on the substrate. For example, the substrate and the sealing glass have a hemispherical shape, the LED package has a spherical shape as the whole, and the light-emitting device is mounted via the circuit frame on a circular flat surface of the substrate. Also, the substrate and the sealing glass have a long and narrow semicolumnar shape, and a LED package has a long and narrow columnar shape as the whole, and the light-emitting device is mounted via the circuit frame on a flat rectangular surface of the substrate. When the circuit frame is used, production process can be further simplified by using the same material for the substrate and the sealing glass.

According to the LED package of the present invention, a glass substrate is used for mounting light-emitting device, and the linear expansion coefficient of the substrate is set 0.9 times to 1.1 times the linear expansion coefficient of the sealing glass. Therefore, the occurrence of cracks can be suppressed, and the reliability of the LED package can be improved. Since the substrate and the sealing member are both made of glass, there is no deterioration due to heat or light, thereby achieving high reliability. Moreover, a LED package emitting light in all directions can be achieved.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

First Embodiment

Figure 1A:
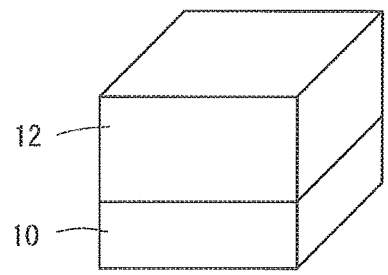
FIGS. 1A and 1B are schematic views showing the structure of a LED package according to a first embodiment.
Figure 1B:
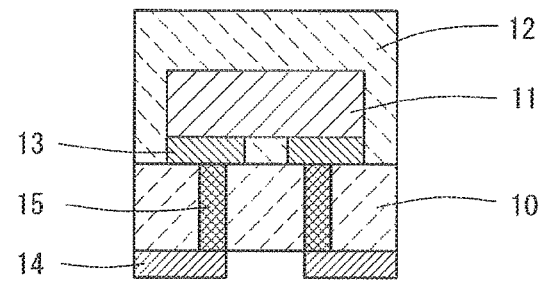

FIGS. 1A and 1B are schematic views showing the structure of a LED package according to a first embodiment. FIG. 1A is a perspective view looking down at the whole from the above, and FIG. 1B is a cross-sectional view. The LED package according to the first embodiment, as shown in FIG. 1B, comprises a substrate 10, a LED 11 mounted on the substrate 10, and a sealing glass 12 formed on the substrate 10 for sealing the LED 11, and has a cubic shape as the whole. The LED package according to the first embodiment is a LED package emitting white light in all directions.

(Structure of Substrate 10)

The substrate 10 is a square flat plate made of glass. The substrate 10 may have any one side length or thickness. However, considering heat radiation or physical strength, the one side length is preferably 500 μm to 2,000 μm, and the thickness is preferably 50 μm to 200 μm.

The surface of the substrate 10 (the surface on which the LED 11 is mounted) has a wiring pattern 13 being connected to an electrode of the LED 11. The wiring pattern 13 is formed by depositing, for example, W, Ni, and Au in this order on the substrate 10. The wiring pattern 13 comprises a p-side pattern being connected to a p-electrode of the LED 11 and an n-side pattern being connected to an n-electrode of the LED 11. A part of the surface of the substrate 10 on which the wiring pattern 13 is not formed may be coated with a fluorescent paint. This can control the color of light extracted from the rear surface of the substrate 10. The LED package according to the first embodiment has a structure in which light is also extracted from the rear surface of the substrate 10. To extract the light only upward or control the light distribution property, a part on the surface of the substrate 10 on which the wiring pattern 13 is not formed may be coated with white pigment such as titanium dioxide to reflect light. Alternatively, a high reflection metal such as Al and Ag may be formed by plating to reflect light.

A back electrode pattern 14 is formed on a rear surface of the substrate 10 (a surface opposite to the surface on which the LED 11 is mounted). The back electrode pattern 14 is formed of the same materials as those of the wiring pattern 13, but may be formed of different conductive materials. A part of the rear surface of the substrate 10 on which the back electrode pattern 14 is not formed may be coated with a fluorescent paint. The LED package according to the first embodiment has a structure in which light is also extracted from the rear surface of the substrate 10. To extract the light only upward or control the light distribution property, a part on the rear surface of the substrate 10 on which the back electrode pattern 14 is not formed may be coated with white pigment such as titanium dioxide to reflect light. Alternatively, a high reflection metal such as Al and Ag may be formed by plating to reflect light.

A columnar via 15 is formed on the substrate 10. The via 15 has a structure in which a through hole passing through in a thickness direction of the substrate 10 is filled with a conductive material. The wiring pattern 13 on the surface of the substrate 10 and the back electrode pattern 14 on the rear surface of the substrate 10 are electrically connected through the via 15.

The wiring pattern 13 and the back electrode pattern 14 may be formed by a method such as vapor deposition, screen printing, and plating. A through hole of the via 15 may be formed by laser processing. Plating may be used as a method for forming the via by filling the through hole with a conductive material.

An area of the wiring pattern 13 is preferably not more than 50% the area of the surface of the substrate 10. This is to secure a large contact area between the substrate 10 and the sealing glass 12, and to enhance adhesion between the substrate 10 and the sealing glass 12. When the area of the wiring pattern 13 is larger, it may lead to adhesion problem between the substrate 10 and the sealing glass 12, or between the substrate 10 and the wiring pattern 13. The area of the wiring pattern 13 is more preferably not more than 40%, and further preferably, not more than 30% the area of the surface of the substrate 10. A lower limit for the area of the wiring pattern 13 is not specifically set. It may be within a range where a sufficient electric conduction is attained between the LED 11 and the back electrode pattern 14 on the rear surface of the substrate 10.

The area of the back electrode pattern 14 is preferably not more than 50% the area of the rear surface of the substrate 10 to improve light extraction from the rear surface of the substrate 10. The area of the back electrode pattern 14 is more preferably, not more than 30%, and further preferably, not more than 20% the area of the rear surface of the substrate 10. A lower limit for the area of the back electrode pattern 14 is not specifically set. It is preferably within a range where a sufficient electric conduction is attained between the back electrode pattern 14 and the outside. However, considering heat radiation through the back electrode pattern 14, the area of the back electrode pattern 14 is preferably not less than 10% the area of the rear surface of the substrate 10. On the rear surface of the substrate 10, a heat sink for increasing heat radiation may be provided in addition to the back electrode pattern 14.

The substrate 10 is made of glass material such as zinc oxide based glass, phosphoric acid based glass, boric acid based glass, fluorine based glass, $Bi_2O_3$ based glass, $Nb_2O_5$ based glass, $GeO_2$ based glass, $Ga_2O_3$ based glass, $Y_2O_3$ based glass, $La_2O_3$ based glass, $Gd_2O_3$ based glass, and $Ta_2O_5$ based glass. The glass material may contain $Nb_2O_5$, $TiO_2$, $Al_2O_3$ and others to achieve high refractive index, and $Na_2O$, $Li_2O$ and others to achieve low melting point.

The linear expansion coefficient of the substrate 10 is set 0.9 times to 1.1 times the linear expansion coefficient of the sealing glass 12. This can suppress the occurrence of cracks in the substrate 10 or the sealing glass 12 due to a difference in linear expansion coefficient. The linear expansion coefficient of the substrate 10 is more preferably, 0.93 times to 1.07 times, and further preferably, 0.95 times to 1.05 times the linear expansion coefficient of the sealing glass 12. The linear expansion coefficient of the substrate 10 can be adjusted by appropriately selecting a glass material being a base material or mixing a thermal expansion suppressing agent in the glass. Specific value of the linear expansion coefficient of the substrate 10 is preferably 4.5 ppm/° C. to 5.5 ppm/° C., more preferably, 4.65 ppm/° C. to 5.35 ppm/° C., and further preferably, 4.75 ppm/° C. to 5.25 ppm/° C., in relation to the linear expansion coefficient of the LED 11.

The softening point of the substrate 10 is set higher than the softening point of the sealing glass 12. As used herein, "softening point" refers to a temperature at which glass starts to soften and deform, and a value measured according to the method specified in JIS R 3103-1:2001. By making the softening point of the substrate 10 higher than the softening point of the sealing glass 12 and making the sealing temperature lower than the softening point of the substrate 10, the substrate 10 can be prevented from being softened when the LED 11 is sealed with the sealing glass 12. This can prevent deformation of the substrate 10 or dislocation or distortion of the wiring pattern 13 and the back electrode pattern 14 so that the LED 11 can be accurately sealed with the sealing glass 12. The softening point of the substrate 10 may be adjusted by using the same base material as that of the sealing glass 12 and changing the mixing amount of the mixture.

The softening point of the substrate 10 is preferably 100° C. or higher than softening point of the sealing glass 12. Increasing the difference in the softening point between the substrate 10 and the sealing glass 12 can make the sealing temperature higher so that the LED 11 is sealed with the more softened sealing glass 12. Thus, glass sealing can be easily performed. The softening point of the substrate 10 is more preferably, 150° C. or higher than softening point of the sealing glass 12. The sealing temperature is preferably not more than 600° C. to prevent thermal deterioration of the LED 11. Therefore, the softening point of the substrate 10 is preferably higher than 600° C., more preferably, 650° C. or higher, and further preferably, 700° C. or higher.

In the substrate 10, the yellow fluorescent paint is mixed as in the sealing glass 12. This achieves white light emission by converting a part of blue light emitted from the LED 11 to the rear surface of the substrate 10 into yellow light in the substrate 10, and by mixing the blue light and the yellow light. That is, the LED package according to the first embodiment emits white light from the rear surface of the substrate 10 as well. This achieves the LED package emitting the same color light in all directions. Although yellow fluorescent paint is used in the first embodiment, various fluorescent paints may be mixed in the substrate 10 according to the color of the light emitted from the LED 11, the color of the light emitted as the entire LED package, and the color temperature. Needless to say, the LED package may have a structure in which a light emitted from the LED 11 is extracted as it is without mixing the fluorescent paint in the substrate 10 and with keeping the substrate 10 transparent. The substrate 10 may be left transparent, and the color of the light emitted from the rear surface of the substrate 10 may be controlled by the fluorescent paint applied to the surface or the rear surface of the substrate 10.

A diffusion agent, a coloring agent, or thermal expansion suppressing agent may be mixed in the substrate 10. The directivity of the LED package may be adjusted by mixing a diffusion agent in the substrate, and the appearance color of the LED package may be adjusted by mixing a coloring agent in the substrate 10, thereby improving design. A thermally conductive filler made of material having high thermal conductivity may be mixed in the substrate 10. Enhancing thermal conductivity of the substrate 10 can improve heat radiation and suppress thermal deterioration of the LED package. A diffusion agent may be mixed in the substrate 10 to uniformly disperse these particles in the substrate 10.

(Structure of LED 11)

The LED 11 is a flip-chip type Group III nitride semiconductor light-emitting device, and has a square shape in a plan view. The LED 11 emits a blue light having an emission wavelength of 450 nm, and the linear expansion coefficient (average of the entire LED 11) is 5 ppm/° C. The LED 11 is flip-chip mounted on the substrate 10, and the electrode of the LED 11 is connected to the wiring pattern 13 on the substrate 10 via a bump (not illustrated). The LED 11 may have any conventional device structure.

In the LED package according to the first embodiment, one LED 11 is mounted on the substrate 10. However, a plurality of LEDs 11 may be mounted.

An underfill may be formed to fill a gap between the LED 11 and the substrate 10 so that a gap is prevented from being formed when sealing by the sealing glass 12. This can suppress breakage of the connection between the LED 11 and the substrate 10, and suppress thermal deterioration. The underfill may be made of sol gel glass. The linear expansion coefficient of the sol gel glass used as the underfill is preferably 0.9 times to 1.1 times the linear expansion coefficient of the sealing glass 12. Thermal deterioration can be further suppressed.

(Structure of Sealing Glass 12)

The sealing glass 12 is formed on the substrate 10 to cover and seal the LED 11. The sealing glass 12 has a rectangular parallelepiped shape, and the side surfaces thereof are aligned with the substrate 10 so that the substrate 10 and the sealing glass 12 are combined into a cube.

ZnO based glass, phosphoric acid based glass, fluorine based glass, $Bi_2O_3$ based glass, $Nb_2O_5$ based glass, $GeO_2$ based glass, $Ga_2O_3$ based glass, $Y_2O_3$ based glass, $La_2O_3$ based glass, $Gd_2O_3$ based glass, and $Ta_2O_5$ based glass may be used as the material of the sealing glass 12. The material may contain $Nb_2O_5$, $TiO_2$, $Al_2O_3$ and others to achieve high refractive index, and $Na_2O$, $Li_2O$ and others to achieve low melting point.

The linear expansion coefficient of the sealing glass 12 is preferably as close as possible to the linear expansion coefficient of the LED 11. For example, the linear expansion coefficient of the sealing glass 12 is preferably 0.9 times to 1.1 times the linear expansion coefficient of the LED 11. Damage such as crack of the sealing glass 12 caused by thermal expansion coefficient difference is reduced, and thereby achieving a LED package more resistant to temperature change. The linear expansion coefficient of the sealing glass 12 is more preferably, 0.93 times to 1.07 times, and further preferably, 0.95 times to 1.05 times the linear expansion coefficient of the LED 11. The linear expansion coefficient of the Group III nitride semiconductor LED 11 is approximately 5 ppm/° C. The linear expansion coefficient of the sealing glass 12 is preferably 4.5 ppm/° C. to 5.5 ppm/° C., more preferably, 4.65 ppm/° C. to 5.35 ppm/° C., and further preferably, 4.75 ppm/° C. to 5.25 ppm/° C.

The softening point of the sealing glass 12 is set lower than the sealing temperature. The melting point of the sealing glass 12 is set higher than the sealing temperature. Since the softening point and the melting point of the sealing glass 12 are set as described above, the LED 11 can be accurately sealed with the sealing glass 12. The sealing temperature is preferably not more than 600° C. to prevent the deterioration of the LED 11 due to heat. Therefore, the softening point of the sealing glass 12 is preferably 200° C. to 500° C., and more preferably, 250° C. to 450° C. The melting point of the sealing glass 12 is preferably not less than 500° C.

A yellow fluorescent paint is mixed in the sealing glass 12. Thereby, a white light is emitted by converting a part of blue light emitted upward from the LED 11 (in a direction opposite to the substrate 10) into a yellow light through the sealing glass 12, and by mixing the blue light and the yellow light. In the LED package according to the first embodiment, a white light is emitted from both the top surface of the LED 11 and the rear surface of the substrate 10 so that the white light is emitted in all directions. Although the yellow fluorescent paint is used in the first embodiment, various fluorescent paint may be mixed in the sealing glass 12 according to the color of the light emitted from the LED 11, the color of the light emitted as the entire LED package, and the color temperature. Needless to say, the LED package may have a structure in which a light emitted from the LED 11 is extracted as it is without mixing the fluorescent paint in the sealing glass 12 and with keeping the sealing glass 12 transparent. The color of the light emitted upward from the LED may be controlled by the fluorescent paint applied to the surface of the transparent sealing glass 12.

A diffusion agent, a coloring agent, or a thermal expansion suppressing agent, a thermal conductive filler, and a dispersant may be mixed in the sealing glass 12, same as in the substrate 10. By mixing these, the characteristics (such as temperature characteristics, physical characteristics, and chemical characteristics) can be almost matched between the sealing glass 12 and the substrate 10, and thereby achieving a LED package having excellent environmental resistance. A LED package can be achieved, which emits lights with the same color in all directions (such as white lights with the same color temperature in all directions).

(Processes for Producing LED Package)

Figure 2A:
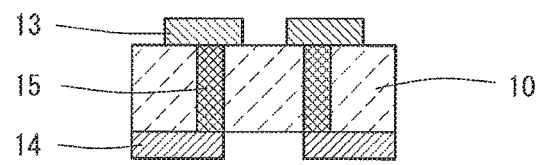
FIGS. 2A to 2C are sketches showing processes for producing the LED package according to the first embodiment.

Next, a method for producing the LED package according to the first embodiment will be described with reference to FIGS. 2A to 2C.

Firstly, glass component powder is heated and melted, stirred, and then cooled and hardened. After that, a glass plate being a material of a substrate 10 is prepared by slicing the hardened glass into plates with a predetermined thickness. A through hole is formed by laser processing or wet etching at a predetermined position of the glass plate. A via 15 is formed by filling the through hole with a conductive material through plating. Subsequently, a conductive material is formed in a predetermined pattern through vapor deposition, screen printing, plating on each of the surface and the rear surface of the glass plate, to form a wiring pattern 13 and a back electrode pattern 14. Thus, the substrate 10 is produced (FIG. 2A).

Figure 2B:
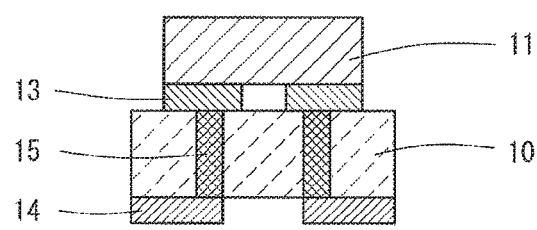
Figure 2C:
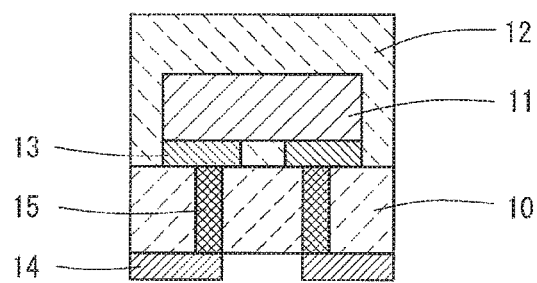

Subsequently, a LED 11 is flip-chip mounted on the substrate 10 (FIG. 2B). That is, a bump is formed on an electrode of LED 11, and aligned with a predetermined position of the wiring pattern 13 of the substrate 10 with the electrode side of the LED 11 facing toward the substrate 10. The bump is melted by ultrasonic vibration to connect the electrode of the LED 11 and the wiring pattern 13 on the substrate 10.

Then, the substrate 10 is preheated by a heater under inert atmosphere such as nitrogen at normal pressure. The temperature needs to be lower than the softening point of the substrate 10 and higher than the softening point of the sealing glass 12, and preferably as close as possible to the sealing temperature (the temperature of the sealing glass 12 when sealing). The substrate is preferably heated up to the same temperature as the sealing temperature. Preheating the substrate 10 improves the adhesiveness with the sealing glass 12 in the later step. Preheating may be omitted if the adhesiveness with the sealing glass 12 is sufficiently ensured.

A sealing glass 12 is prepared, and preheated by a heater under inert atmosphere such as nitrogen at normal pressure. The sealing glass 12 is produced as follows. Firstly, glass component powder is heated and melted, stirred, and then cooled and hardened. After that, a glass plate being a material of the sealing glass 12 is prepared by slicing the hardened glass into plates with a predetermined thickness. A recess may be previously formed at places corresponding to the LED 11 of the sealing glass 12, to facilitate the sealing of the LED 11.

When the sealing glass 12 is preheated to the sealing temperature and the sealing glass 12 is softened, the substrate 10 and the sealing glass 12 are bonded so as to be closely adhered to each other. The sealing temperature is any temperature in a range between the softening point of the substrate 10 and the softening point of the sealing glass 12. Thus, when the substrate 10 and the sealing glass 12 are bonded, the LED 11 on the substrate 10 is also sealed with the sealing glass 12 (FIG. 2C). In the LED package according to the first embodiment, the top surface of the sealing glass 12 is flat. However, the top surface of the sealing glass 12 may be formed in a lens shape by using a press die when sealing.

The sealing temperature needs to be equal to or more than the softening point of the sealing glass 12, and preferably not more than 600° C. so as to suppress thermal deterioration of the LED 11. The sealing temperature is more preferably, 300° C. to 550° C., and further preferably, 350° C. to 500° C.

The pressure of atmosphere when sealing is preferably not more than 380 torr, and more preferably, not more than 76 torr to prevent air bubbles from remaining in glass. When sealing, the temperature of the sealing glass 12 may be different from the temperature of the substrate 10. However, the temperature of the sealing glass is preferably the same as the temperature of the substrate to suppress cracks caused by a difference in linear expansion coefficient when cooling.

Sealing may be performed under an atmosphere obtained by mixing oxygen with the inert gas to prevent the sealing glass 12 from being colored by reducing action. The volume percentage of oxygen in the inert gas is preferably, not more than 20%, and more preferably, not more than 5%.

After that, heating by a heater is stopped, and the sealing glass 12 is naturally cooled to a room temperature. From the above, the LED package according to the first embodiment is produced.

(Effect of LED Package According to the First Embodiment)

The following effect is obtained by the LED package according to the first embodiment. The LED package according to the first embodiment is free of deterioration due to heat or light and superior in reliability because both the sealing glass 12 sealing the LED 11 and the substrate 10 having the LED 11 mounted thereon are made of glass. The linear expansion coefficient of the substrate 10 is set 0.9 times to 1.1 times the linear expansion coefficient of the sealing glass 12. This can prevent cracks from occurring in the sealing glass 12 or the substrate 10 due to a difference in linear expansion coefficient. Since the transition point of the substrate 10 is higher than the transition point of the sealing glass 12, the substrate 10 is not softened and only the sealing glass 12 is softened when sealing, thereby accurately sealing the LED 11 with the sealing glass 12. Since the substrate 10 is made of glass, light can be extracted even from the rear surface of the substrate 10, thereby achieving a LED package emitting light in all directions.

Second Embodiment

Figure 3A:
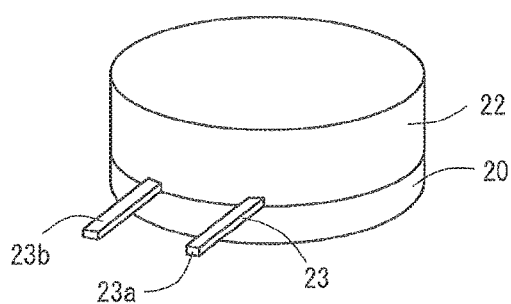
FIGS. 3A and 3B are schematic views showing the structure of a LED package according to a second embodiment.
Figure 3B:
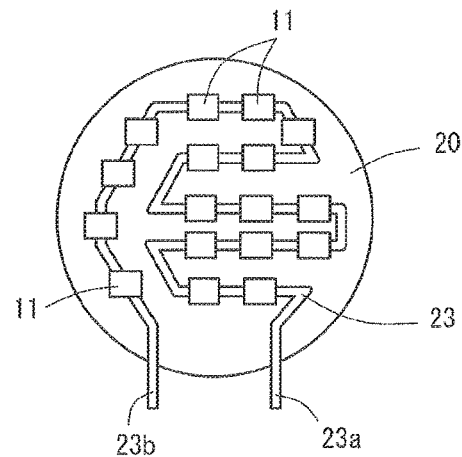

FIGS. 3A and 3B are schematic views showing the structure of a LED package according to the second embodiment. FIG. 3A is a view looking down at an angle the LED package according to the second embodiment, and FIG. 3B is a plan view of the LED package according to the second embodiment. The LED package according to the second embodiment comprises, as shown in FIG. 3B, a substrate 20 and a plurality of LEDs 11, a circuit frame 23, a sealing glass 22, and has a disc shape as a whole. The sealing glass 22 is omitted in FIG. 3B.

The substrate 20 is a circular flat plate (disc shape) made of the same glass material as that of the substrate 10. On the substrate 20, a circuit frame 23 is formed. The circuit frame 23 is a linear metal plate connecting a plurality of LEDs 11 in series. Both ends 23a and 23b of the circuit frame 23 respectively protrude to the outside from the ends of the substrate 20. The sealing glass 22 has a disc shape having the same radius as that of the substrate 20. The sealing glass 22 is formed with the side surface aligned with the substrate 20 on the substrate 20 to seal the plurality of LEDs 11 and a part of the circuit frame 23. The sealing glass 22 is made of the same material as that of the sealing glass 12.

The LED package according to the second embodiment is remarkably different in that a circuit pattern is formed by using a circuit frame 23 instead of the substrate 10 on which the wiring pattern 13 or the back electrode pattern 14 is formed. The substrate 20 having various shapes may be used by using the circuit frame 23. Since no processing is required for forming a wiring pattern on the substrate 20, the production process is simplified.

The LED package according to the second embodiment can obtain the same effect as that of the LED package according to the first embodiment. That is, there is no deterioration due to heat or light, resulting in high reliability. Cracks can be prevented from occurring on the sealing glass 22 or the substrate 20. The LED 11 can be accurately sealed with the sealing glass 22. A LED package emitting light in all directions can be achieved.

Next will be described processes for producing the LED package according to the second embodiment. Firstly, a disc substrate 20 is prepared, and preheated. The preheating conditions are the same as the conditions for preheating the substrate 10 in the first embodiment. Preheating of the substrate 20 may be omitted for the same reason as in the first embodiment.

The substrate 20 may be softened by raising the temperature higher than the softening point, and the circuit frame 23 may be crimped and fixed to the substrate 20 by pressing the circuit frame 23 on the substrate 20. Since the circuit frame 23 is fixed on the substrate 20, displacement of the circuit frame 23 is prevented, and the LED 11 is more accurately sealed.

A disc sealing glass 22 is prepared, and preheated by a heater. The preheating conditions are the same as the conditions for preheating the sealing glass 12 in the first embodiment. A recess may be previously formed at places corresponding to the LED 11 of the sealing glass 12, to facilitate the sealing of the LED 11.

When the sealing glass 22 is preheated to the sealing temperature and the sealing glass 22 is softened, the circuit frame 23 connected with a plurality of LEDs 11, is mounted on the substrate 20. At this time, both ends 23a and 23b of the circuit frame 23 are protruding from the substrate 20. The substrate 20 and the sealing glass 22 are bonded with the side surfaces aligned so as to be closely adhered. Thus, when the substrate 20 and the sealing glass 22 are bonded, the LED 11 on the substrate 20 is also sealed with the sealing glass 22. The conditions such as temperature, atmosphere, and pressure when sealing are the same as those when sealing in the first embodiment.

Since both ends 23a and 23b of the circuit frame 23 protrude to the outside from the side surface of the sealing glass 22, the circuit frame 23, the sealing glass 22, and the substrate 20 need to be sufficiently adhered so as not to form a gap at the side surface. After the above sealing process or at the same time as the above sealing process, the circuit frame 23 may be sealed by pinch sealing. That is, the circuit frame 23, the sealing glass 22, and the substrate 20 are sufficiently adhered at the ends by heating to melt and pressurizing to deform the vicinity of the region where the circuit frame 23 protrudes to the outside from the sealing glass 22.

Thereafter, heating by a heater is stopped, and the sealing glass 22 is naturally cooled to a room temperature. From the above, the LED package according to the second embodiment is produced.

Third Embodiment

Figure 4A:
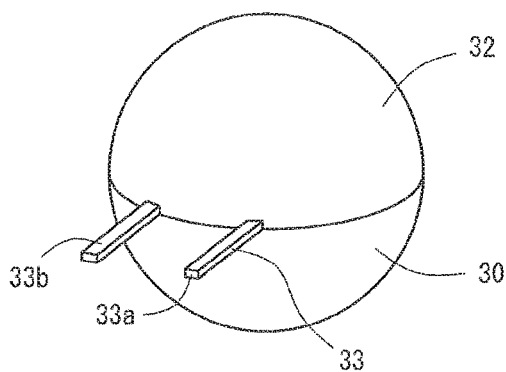
FIGS. 4A and 4B are schematic views showing the structure of a LED package according to a third embodiment.
Figure 4B:
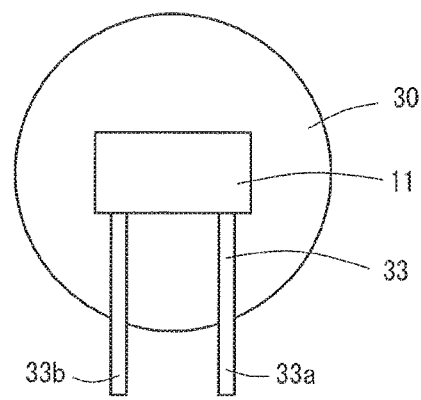

FIGS. 4A and 4B are schematic views showing the structure of a LED package according to a third embodiment. FIG. 4A is a view looking down at an angle the LED package according to the third embodiment, and FIG. 4B is a plan view of the LED package according to the third embodiment. As shown in FIGS. 4A and 4B, the LED package according to the third embodiment comprises a substrate 30, a LED 11, a circuit frame 33, and a sealing glass 32, and has a spherical shape as the whole. In FIG. 4B, the sealing glass 32 is omitted.

The substrate 30 has a hemispherical shape as shown in FIGS. 4A, and made of the same glass material as that of the substrate 10. A circuit frame 33 is formed on a circular flat surface of the substrate 30. The circuit frame 33 is a linear metal plate for connecting one LED 11. Both ends 33a and 33b of the circuit frame 33 protrude to the outside from the end of the substrate 30. The sealing glass 32 has the same hemispherical shape as the substrate 30. The sealing glass 32 is formed with the circular flat surface thereof matched to the circular flat surface of the substrate 20 so as to seal the LED 11 and a part of the circuit frame 33. The sealing glass 32 is made of the same material as that of the sealing glass 12.

In the LED package according to the third embodiment, a circuit frame 33 is formed separately from a substrate 30, and a wiring pattern 13 or a back electrode pattern 14 is not formed as on the substrate 10 of the first embodiment. Therefore, when preheating or sealing the substrate 30, the substrate 30 may be formed in a hemispherical shape using a press die. In that case, the substrate 30 may be made of a material having a softening point lower than a sealing temperature instead of the same material as that of the substrate 10. Production process can be more simplified by forming both the substrate 30 and the sealing glass 32 when sealing. In this case, the substrate 30 and the sealing glass 32 may be formed of the same material, and the softening points may be the same, thereby more simplifying the production process.

Since the LED package according to the third embodiment has a spherical shape as the whole, emitted light can be focused in a specific direction due to the lens effect. The same effect as that of the LED package according to the first embodiment can be obtained.

Fourth Embodiment

Figure 5A:
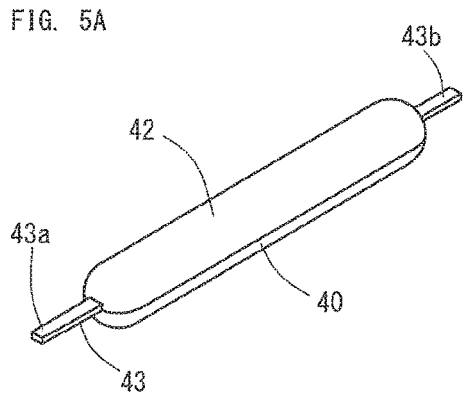
FIGS. 5A and 5B are schematic views showing the structure of a LED package according to a fourth embodiment.
Figure 5B:
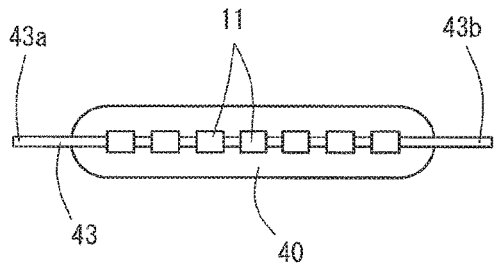

FIGS. 5A and 5B are schematic views showing the structure of the LED package according to the fourth embodiment. FIG. 5A is a perspective view looking down at an angle the LED package according to the fourth embodiment, and FIG. 5B is a plan view of the LED package according to the fourth embodiment. The LED package according to the fourth embodiment comprises a substrate 40, a plurality of LEDs 11, a circuit frame 43, and a sealing glass 42, and has a long and narrow columnar shape with both ends rounded in a hemispherical shape as shown in FIGS. 5A and 5B. For example, the length of the column is five times or more the diameter of the column.

The substrate 40 has a semicolumnar shape by cutting in half a long and narrow columnar object with both ends rounded in a hemispherical shape at a plane parallel to a central axis as shown in FIGS. 5A and 5B. The substrate 40 is made of the same material as that of the substrate 10. A circuit frame 43 is formed on a rectangular flat surface of the substrate 40. The circuit frame 43 is a linear metal plate for connecting a plurality of LEDs 11 in series, and is arranged along a long axis direction of the substrate 40. One end 43a of the circuit frame 43 protrudes to the outside from the one end of the substrate 40, and the other end 43b of the circuit frame 43 protrudes to the outside from the other end of the substrate 40. The sealing glass 42 has the same shape as that of the substrate 40 and is made of the same material as that of the sealing glass 12. The sealing glass 42 is arranged with a flat surface thereof matched to a flat surface of the substrate 40 so as to seal a plurality of LEDs 11 and a part of the circuit frame 43.

In the LED package according to the fourth embodiment, the substrate 40 may be formed using a press die when preheating or sealing by using a material having a softening point lower than a sealing temperature instead of the same material of the substrate 10 as a material of the substrate 40, as in the LED package according to the third embodiment. This can further simplify the production process. In this case, the substrate 40 and the sealing glass 42 may be made of the same material having the same softening point, thereby further simplifying the production process.

Since the LED package according to the fourth embodiment has a long and narrow columnar shape, and can emit light in all directions, it is suitable as a filament light source in the illumination apparatus. The LED package according to the fourth embodiment can obtain the same effect as that of the LED package according to the first embodiment.

Variation

In the embodiments, a Group III nitride semiconductor blue light-emitting device is used as a light-emitting device. However, the material of the light-emitting device is not limited to Group III nitride semiconductor, and the color of emitting light is not limited to blue. For example, a Group III nitride semiconductor ultraviolet light-emitting device may be used. In the embodiments, a flip-chip type light-emitting device is used, in which a flip chip is mounted on the substrate 10. However, a face-up type or a vertical type light-emitting device may be used.

The shape of the substrate or the sealing glass and the shape of the LED package as a whole is not limited to the shape shown in the embodiments, and any shape may be used. Particularly, as in the second to fourth embodiments, a LED package having any shape can be easily achieved by using the circuit frame. For example, unevenness of a desired shape is formed on the rear surface of the substrate or the surface of the sealing glass so as to improve design or control light distribution property. Moreover, a periodic uneven structure is formed on the rear surface of the substrate or the surface of the sealing glass so as to improve light extraction efficiency.

The LED package of the present invention can be employed as a light source of a display apparatus or an illumination apparatus.

What is claimed is:

1. A LED package comprising:
   a substrate having a flat front surface;
   a light-emitting device comprising a Group III nitride semiconductor and emitting a blue light mounted on the front surface of the substrate;
   a sealing glass formed on the entire front surface of the substrate for sealing entire surfaces of the light-emitting device;
   a wiring pattern being formed on the front surface of the substrate on which the light-emitting device is mounted and being connected to electrodes of the light-emitting device;
   a via passing through the substrate and being connected to the wiring pattern; and
   a back electrode pattern being formed on a rear surface opposite to the front surface of the substrate and being connected to the wiring pattern through the via,
   wherein the substrate is made of glass, and the linear expansion coefficient of the substrate is 0.9 times to 1.1 times the linear expansion coefficient of the sealing glass,
   wherein the softening point of the substrate is higher than 600° C. and the softening point of the sealing glass is 200° C. to 500° C.,
   wherein the yellow fluorescent paints are mixed in the substrate and the sealing glass, a white light is emitted from both the top surface of the light-emitting device and the rear surface of the substrate so that the white light is emitted in all directions, and
   wherein the sealing glass covers and seals the light-emitting device and has a rectangular parallelepiped shape, and side surfaces thereof are aligned with side surfaces of the substrate so that the substrate and the sealing glass are combined into one shape.

2. The LED package according to claim 1, wherein a part on the back surface of the substrate on which the back electrode pattern is not formed is coated with at least one member selected from a group consisting of a fluorescent paint, white pigment and reflection metal.

3. The LED package according to claim 1, wherein the substrate is made of at least one glass material selected from a group consisting of zinc oxide based glass, phosphoric acid based glass, boric acid based glass, fluorine based glass, $Bi_2O_3$ based glass, $Nb_2O_5$ based glass, $GeO_2$ based glass, $Ga_2O_3$ based glass, $Y_2O_3$ based glass, $La_2O_3$ based glass, $Gd_2O_3$ based glass, and $Ta_2O_5$ based glass.

4. The LED package according to claim 1, wherein the sealing glass is made of at least one glass material selected from a group consisting of ZnO based glass, phosphoric acid based glass, fluorine based glass, $Bi_2O_3$ based glass, $Nb_2O_5$ based glass, $GeO_2$ based glass, $Ga_2O_3$ based glass, $Y_2O_3$ based glass, $La_2O_3$ based glass, $Gd_2O_3$ based glass, and $Ta_2O_5$ based glass.

5. The LED package according to claim 1, wherein the linear expansion coefficients of the substrate and the sealing glass are 4.5 ppm/° C. to 5.5 ppm/° C., respectively.

* * * * *